(12) United States Patent
Allred, III et al.

(10) Patent No.: US 6,564,084 B2
(45) Date of Patent: May 13, 2003

(54) MAGNETIC FIELD SHIELDING AND DETECTING DEVICE AND METHOD THEREOF

(75) Inventors: Jimmie B. Allred, III, Skaneateles, NY (US); Frederic H. Metildi, Penfield, NY (US); William Chieffo, Souderton, PA (US)

(73) Assignee: Draeger Medical, Inc., Telford, PA (US)

( * ) Notice: Subject to any disclaimer, the term of this patent is extended or adjusted under 35 U.S.C. 154(b) by 75 days.

(21) Appl. No.: 09/798,115

(22) Filed: Mar. 2, 2001

(65) Prior Publication Data

US 2002/0123682 A1 Sep. 5, 2002

(51) Int. Cl.[7] .................................................. A61B 5/05
(52) U.S. Cl. ...................................................... 600/411
(58) Field of Search ................................. 600/411, 407, 600/408, 409, 410, 422; 336/148, 145, 84 R, 84 C, 84 M, 90, 92, 94, 65, 96

(56) References Cited

U.S. PATENT DOCUMENTS

| | | | | |
|---|---|---|---|---|
| 3,683,302 A | * | 8/1972 | Butler et al. ................. | 336/174 |
| 3,887,889 A | * | 6/1975 | Karlov et al. ................ | 336/146 |
| 4,749,939 A | * | 6/1988 | Seitz ........................ | 324/117 H |
| 4,839,585 A | * | 6/1989 | Bicknell ...................... | 29/605 |
| 4,859,449 A | * | 8/1989 | Mattes ........................ | 424/1.49 |
| 5,449,991 A | * | 9/1995 | Owen .......................... | 318/500 |
| 6,071,430 A | * | 6/2000 | Lebourgeois et al. ....... | 252/62.6 |
| 6,272,370 B1 | * | 8/2001 | Gillies et al. ............... | 324/309 |
| 6,402,697 B1 | * | 6/2002 | Calkins et al. .............. | 600/529 |

FOREIGN PATENT DOCUMENTS

| | | |
|---|---|---|
| DE | 25 14 583 | 4/1975 |
| DE | 25 14 583 A1 | 10/1975 |
| DE | 693 10 218 T2 | 11/1993 |
| DE | 44 05 408 C1 | 1/1994 |
| DE | 44 05 408 C1 | 5/1995 |
| DE | 195 45 559 A1 | 7/1996 |
| DE | 196 11 174 C1 | 7/1997 |

* cited by examiner

Primary Examiner—Teresa Walberg
Assistant Examiner—Daniel Robinson
(74) Attorney, Agent, or Firm—Caesar, Rivise, Bernstein, Cohen & Pokotilow, Ltd.

(57) ABSTRACT

The magnetic shield preferably encloses circuitry connected to equipment in a high magnetic field (e.g., two transformers of a gas flow transducer in an MRI suite). The magnetic shield is preferably oriented so that its long axis is aligned with the axis of maximum magnetic sensitivity of the enclosed circuitry. The shield shunts external magnetic flux around the enclosed circuitry to protect the circuitry from saturation in the high magnetic field. The shield is preferably made from hot rolled low carbon steel which has relatively low permeability and saturates slowly. The physical size and construction of the shield reduces magnetic flux within the shield with a minimal amount of iron. In another embodiment, a magnetic field sensor is mounted within the shield to measure the magnetic field affecting the enclosed circuitry. The sensor is coupled to an external circuit which indicates when the magnetic flux is strong enough to affect the operation of the enclosed circuitry.

25 Claims, 5 Drawing Sheets

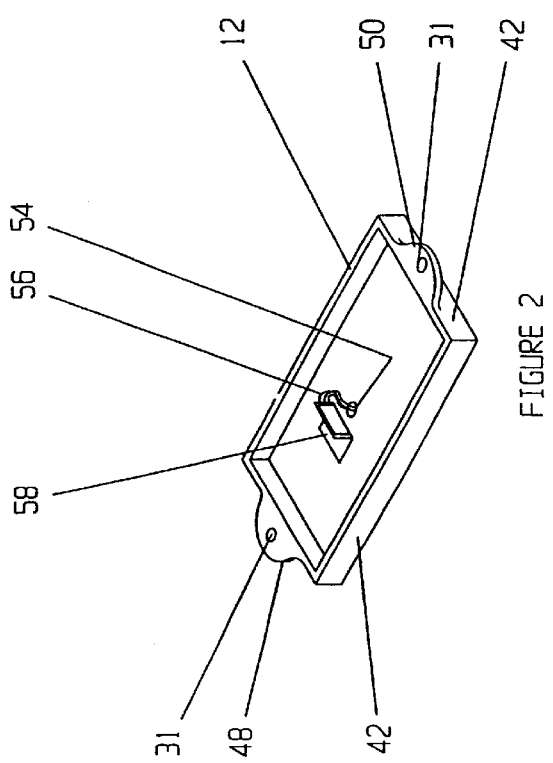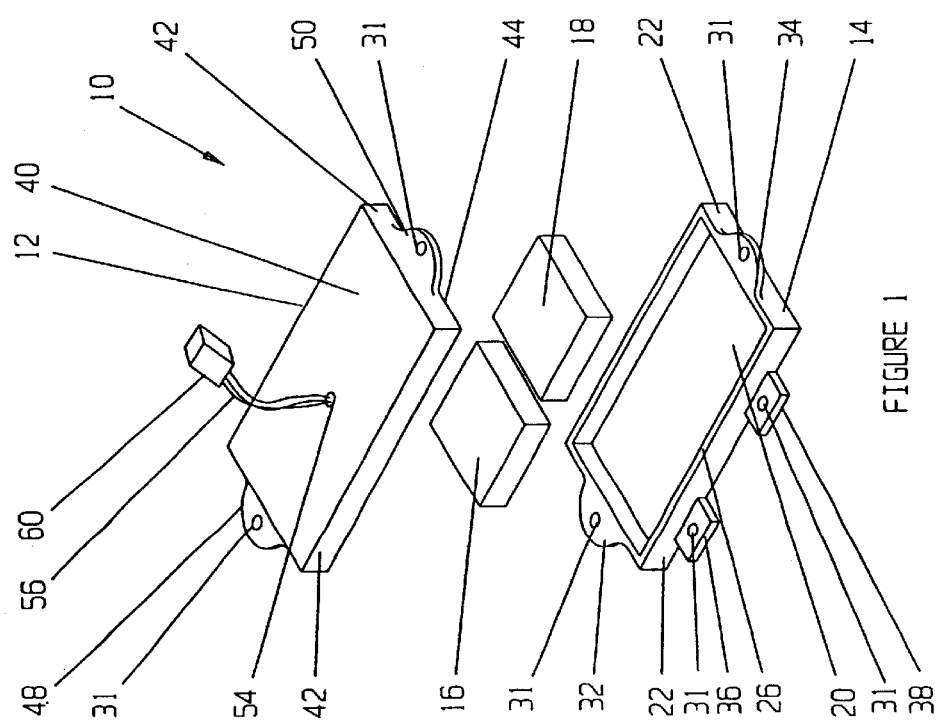

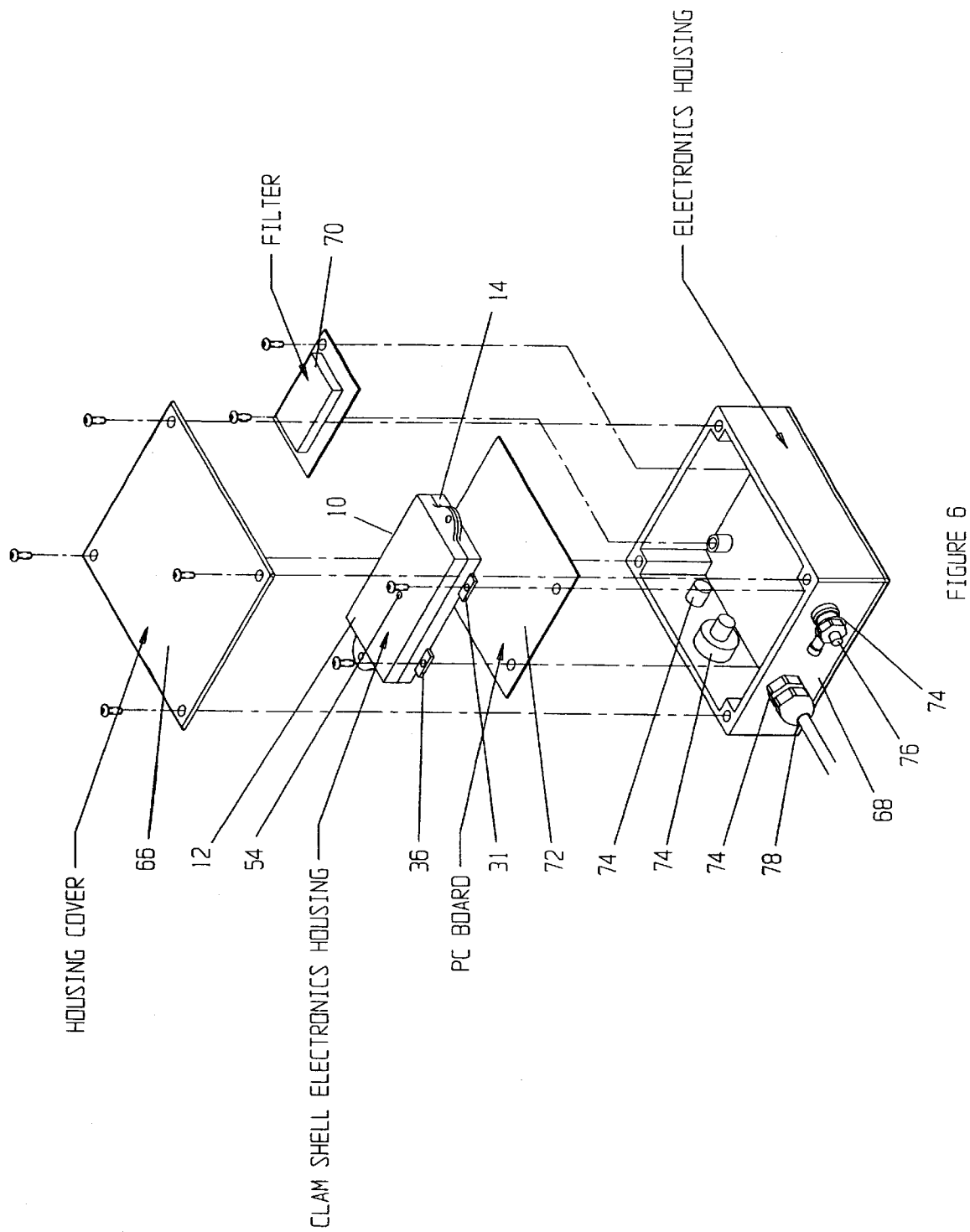

MAGNETIC FIELD SHIELDING AND DETECTING DEVICE AND METHOD THEREOF

FIELD OF THE INVENTION

This invention relates to a system and method for reducing and/or detecting magnetic field interference, and in particular, to a system and method for protecting a circuit in a high strength magnetic field.

BACKGROUND OF THE INVENTION

Magnetic resonance imaging (MRI) is used for non-invasive precision diagnosis of various parts of a body (e.g., soft tissue) without the use of x-rays. An MRI scanner includes a large and very strong magnetic field in which the patient is positioned. A radio antenna is used to transmit an RF signal into the body. If the RF signal is of the correct frequency, protons in the body temporarily align and emit an RF signal weaker than the RF signal transmitted by the antenna. These returning signals are converted into pictures by a computer attached to the scanner.

The strength of the RF signal output from the body is so weak that an ambient RF signal of the same frequency (e.g., a small radio station signal) would wash out the returning signals in an unprotected environment. Therefore, MRI scanners are installed in an MRI suite, and are surrounded by a radio frequency or Faraday shield to protect the MRI scanners from outside RF interference. However, most electronic equipment emits some RF signal at the frequencies of concern. Computers in particular emit an RF signal stronger than the signal coming from the body. Therefore, equipment in an MRI suite must be modified so that it does not emit a radio signal that interferes with the body's emitted signal.

In the presence of an external magnetic field, protons in the body align with the magnetic field and precess at a specific frequency. A high static magnetic field is required to provide the magnetic environment in which the nuclei will emit an RF signal strong enough to be read. The so-called magnetic resonance is created when these protons are energized by RF waves of the same frequency at which the protons precess. In medical imaging, the field strengths used are typically 1.5 tesla (T) which is about 30 thousand times the strength of the earth's magnetic field. This same field is strong enough to pull heavy-duty floor buffers and mop buckets into the bore of the magnet, pull stretchers across the room and turn steel oxygen bottles into flying projectiles. Deaths have occurred from trauma as a result of these effects. Smaller objects (e.g., pagers, bobbie pins and pens) have been known to be pulled off the person carrying them in the magnetic suite. The attraction of ferromagnetic objects by the magnet is the most obvious hazard of the high static magnetic field created by an MRI scanner.

MRI suites must be thoroughly surveyed since all environmental iron is paramagnetic and therefore subject to magnetic flux. It is sometimes necessary to reroute pipes and electrical wiring and remove all stationary environmental iron (e.g., structural steel, floor decking, concrete reinforcing rods) from the suite.

There are three issues for ancillary equipment operating in an MRI suite. These issues are: 1) that the attractive effect of the magnetic fields on the ancillary equipment present no danger; 2) that the ancillary equipment functions properly within the magnetic field; and 3) that the ancillary equipment has no intrinsic effects on the quality of the image produced.

Some of the more significant challenges to patient monitoring in an MRI suite are presented by the two large RF coils which surround the patient. Generally, the outer coil transmits the RF while the inner coil receives the RF emitted from the patient. As noted above, the MRI suite must be shielded from outside RF interference which may affect RF reception. The MRI suite can be RF shielded by lining the walls and windows with continuous sheets or screens, typically of copper. Monitors and cables must be shielded to prevent these devices from introducing RF into the room. For example, cables can be wrapped with a thin layer of aluminum foil or woven copper wire and small copper boxes can be used to house electrical equipment.

The effect of the magnetic field in the MRI suite on equipment depends on the strength of the magnet, the proximity of the equipment to the magnet and, the amount of ferromagnetic material present and the details of the circuitry used in the equipment. The magnetic field decreases as an object is moved away from the magnet bore. It is typically recommended that ferromagnetic materials be kept several feet beyond the point where the magnetic field falls to under 50 gauss.

In general, replacing the paramagnetic components in electronic equipment with non-magnetic stainless steel, brass, aluminum or plastic enables its placement within the MRI suite. However, even with the reduced ferrous load, much of the equipment's smaller, more delicate instrumentation is still ferromagnetic and subject to the magnetic field. Accordingly, the functioning and accuracy of equipment within the suite may still be affected. For example, any piece of equipment utilizing transformers or inductors can malfunction or be damaged in a high strength magnetic field.

MRI magnetic fields will cause transformers or inductor cores to be saturated. Saturation of the transformer or inductor core reduces the core's permeability (inductance) and allows excessive currents which can burn out the transformer or inductor. Accordingly, when possible, patient monitors are generally kept outside the MRI suite, and an external power source is used.

Open magnet MRIs have been recently designed so that intricate neuro-surgical procedures can be performed within an MRI suite, with the patient and surgeon inside the magnet. The very nature of these procedures increases the need for precise and accurate patient monitoring (e.g., invasive, beat and respiratory monitors) in close proximity to the magnet bore where the greatest magnetic field is present.

Anesthesia machines are being specially designed for use in the MRI suite. Most of the machine's ferromagnetic components are replaced with brass, aluminum, non-magnetic stainless steel and plastic to minimize attractive forces. In particular, the frame, chassis and drawers are fabricated from aluminum. In addition, many small components, including fasteners and springs, are formed of either aluminum or non-magnetic stainless steel.

Both circle and re-breathing anesthesia systems can be used for ventilation in the MRI suite. Flow sensors are critical to these anesthesia systems for measuring respiratory flow rate. Ultrasonic flow sensors are fast becoming the flow meter of choice in flows where precision, reliability, and maintainability are important. Time of flight (transit-time) ultrasonic flow sensors measure the difference in time travel between pulses sent with and against the fluid flow. The measurement is based on the principle that it takes longer for the ultrasound to propagate upstream than it does downstream.

Whenever a flow is present, there is a difference in the time of flight between the ultrasonic pulses transmitted upstream and downstream in the respiratory flow path. This difference is used to compute the flow velocity which is then factored with the cross-sectional area of the flow path to yield flow volume. Preferably the two transducers are piezoceramic and are arranged in the path of a gas flow to send alternate sound waves towards each other.

The piezoelectric transducers are typically coupled to transmitter and receiver circuitry by two matching standard iron core wire wound transformers. The transformers are sensitive to saturation from the magnetic field of the MRI. That is, the magnetic field of the MRI can cause the transformer's core to be saturated.

As the permeability of the core decreases, the energy transfer efficiency of the transformer decreases and the impedances of the transformer windings decrease. Both of these changes impact the operation of the transformers that are driving and/or receiving energy from the piezoelectric transducers and therefore affect the operation of the ultrasonic flow sensor. Saturation of the transformer core prevents the production of inductive voltage and excessive currents can burn out a power transformer.

Degradation of a magnetic core is generally gradual up to the saturation flux level of the core. When this level is reached, the core goes into saturation and the permeability of the core approaches the permeability of air. For iron core structures, this can mean a significant change in core permeability. This large change in core permeability causes the gas flow transducer to go from accurate to very inaccurate over a small incremental change in the external magnetic field. In summary, saturation of the transformer core prevents the production of inductive voltage, and excessive currents can burn out the power transformer and adversely affect operation of the sensor.

To insure that the gas flow transducers are not used in a situation where the external magnetic field could cause the problems stated above, it would be beneficial to provide a shield and method of shielding the transformers. It would also be beneficial to provide an approach for measuring the magnetic field strength around the transformers to indicate the presence of a critical external magnetic field.

SUMMARY OF THE INVENTION

Briefly stated, preferred embodiments of this invention provide shielding for a circuit in a magnetic field, protect two or more transformers from a condition of saturation in a magnetic field, and provide an indication of a condition where a circuit is being subjected to a magnetic field that would render the circuit inaccurate.

According to a preferred embodiment of the invention, an exemplary assembly for protecting transformers in a magnetic suite includes the transformers transferring electrical energy from an energy source to a processing circuit, and a magnetic shield enclosing the transformers such that the magnetic shield prevents ambient magnetic flux from interfering with the transformer.

According to another preferred embodiment of the invention, an exemplary method for protecting two or more transformers in a magnetic suite is described. The transformers transfer electrical energy from an energy source to a processing circuit. The method includes enclosing the two transformers in a magnetic shield, the magnetic shield preventing ambient magnetic flux from interfering with the transformers, and enclosing the transformers in a radio frequency (RF) shield housing, the RF shield housing preventing RF signals from entering and exiting the housing. The method may also include mounting a magnetic sensor, preferably positioned between the first and second transformers within the magnetic shield, the sensor measuring the magnetic flux magnitude within the magnetic shield. The magnetic sensor may be coupled to a warning circuit for indicating when the magnetic flux magnitude within the magnetic shield exceeds a predetermined threshold. In addition, the method may also include securing the magnetic shield to an anesthesia device, the anesthesia device arranged for operation in an MRI suite proximate an MRI scanner.

According to another preferred embodiment of the invention, a housing protects two or more transformers from saturation via ambient magnetic flux, the transformers transferring electrical energy from an energy source to a processing circuit. The housing encloses the transformers and includes first and second shielding sections. The first shielding section partially encloses the transformer and includes a first shielding layer formed of a material (e.g., iron) that is permeable to the ambient magnetic flux. The second shielding also partially encloses the transformer and includes a second shielding layer formed of a material (e.g., iron) that is permeable to the ambient magnetic flux. The first and second shielding sections are arranged to fit together to at least substantially completely enclose the transformer and shunt the magnetic flux around the transformer. This embodiment of the invention may also include a sensor mounted within the housing to measure the magnetic flux affecting the transformer, and a warning circuit for determining the magnetic flux and indicating when the magnetic flux exceeds a predetermined threshold. Preferably, the processing circuit includes a flow sensor that measures the respiratory flow rate of a person in an MRI suite.

BRIEF DESCRIPTION OF THE DRAWINGS

The invention will be described in conjunction with the following drawings in which like referenced numerals designate like elements, and wherein:

FIG. 1 is an exploded perspective view of a magnetic flux shielding device in accordance with a preferred embodiment of the present invention;

FIG. 2 is a perspective view of the cover of the magnetic flux shielding device shown in FIG. 1;

FIG. 6 is an exploded view of an exemplary electronics housing used with the shielding device of FIG. 1;

DETAILED DESCRIPTION OF THE PREFERRED EMBODIMENTS

Figure 5:
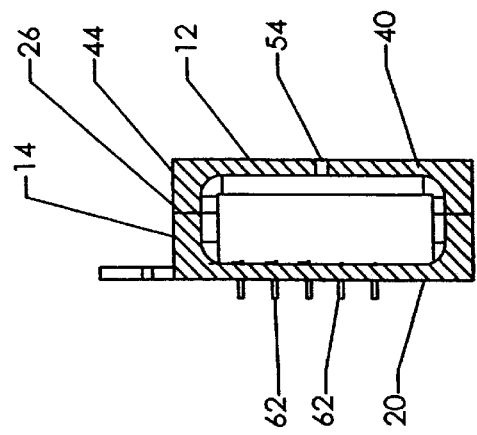
FIG. 5 is a cross-sectional view of the shielding device along line 5—5 of FIG. 3.

Referring now in greater detail to the various figures of the application, an exemplary magnetic flux shielding device 10 (hereinafter referred to as "magnetic shield") of the invention is illustrated in FIG. 1. The magnetic shield 10 includes a top portion 12 and a bottom portion 14 that enclose a transformer circuit having first and second transformers 16 and 18. The magnetic shield 10 is preferably oriented so that its long axis (e.g., length) is aligned with an axis of maximum magnetic sensitivity of the first and second transformers 16, 18. The transformers are generally known to those skilled in the art and preferably include two coils of wire insulated from each other and wound on a common laminated core formed of a material that is permeable to magnetic flux (e.g., iron).

In the preferred embodiments, the transformers 16, 18 are step-up transformers in which energy transfers from a low voltage winding to a high voltage winding. Signals are preferably transferred to and from the transformers 16, 18 via pins (FIG. 4) extending from the transformers 16, 18, as will be described in greater detail below. However, the type of transformer and its connectors depend on the purpose of the transformers. While the magnetic shield 10 is shown enclosing two transformers, it is understood that the number of transformers depends on the applications and requirements of the transformers and the circuits connected to the transformers.

The magnetic shield 10 is preferably made from a hot rolled low carbon steel, which has relatively low permeability. The magnetic shield 10 shunts ambient flux external to the magnetic shield 10 around the transformers 16, 18. In particular, the magnetic shield 10 shunts the magnetic flux around the transformer cores. The magnetic shield 10 is preferably constructed such that the magnetic flux within the shield 10 is reduced with a minimum amount of steel.

The bottom portion 14 of the shield 10 includes a substantially flat base 20 and walls 22 that define a recess 24 for accepting the transformer 16, 18. The walls 22 extend up from the base 20 and include an upper lip 26 defining the circumference of the recess 24. The transformers 16, 18 preferably communicate with an energy source and processing circuit via apertures 28 (FIG. 3) in the base 20 of the bottom portion 14, as will be described in greater detail below. The bottom portion 14 also includes tabs 32, 34, 36, 38 extending from the bottom portion 14 that can be attached to other objects. For example, the tabs 32 and 34 extend from the ends of upper lip 26 for securement to like tabs extending from the top portion 12, as described in greater detail below. The tabs 36, 38 extend from the base 20 and are used for securing the magnetic shield 10 to another object, such as an electronic housing or an anesthesia device, as described in more detail below. Each tab 32, 34, 36, 38 may include a hole 31 there through to aid in securing the tab to the top portion 12 or to an electronic housing as described below.

The top portion 12 includes a roof 40 and walls 42 that define a recess for accepting the transformers 16, 18. The walls 42 extend down from the roof 40 and include a lower lip 44 that preferably aligns with the upper lip 26 of the bottom portion 14. Tabs 48, 50 extend from two sides of the top portion 12. Tabs 48, 50 are preferably similar in size and shape to the tabs 32 and 34 of the bottom portion 14. As shown in FIG. 1, the tabs 32, 34 of the bottom portion 14 preferably align with the tabs 48, 50, respectively, of the top portion 12.

FIG. 2 shows the underside of the cover or top portion 12 of FIG. 1. As shown, the cover includes an aperture 54 through which wires 56 extend, as will be described in greater detail below. Mounted inside the shield 10 and preferably to the underside of the top portion 12 is a magnetic sensor 58. The magnetic sensor 58 measures the magnetic flux at the sensor, and is preferably mounted so it is positioned between the cores of the first and second transformers 16, 18 when the magnetic shield 10 is closed.

As shown in FIGS. 1 and 2, the sensor 58 is connected to wires 56 that extend from the sensor 58 through the aperture 54 in the cover (top portion 12). The wires 56 extend to an external circuit 60 that reads the magnetic flux measured by the sensor 58 and indicates (e.g., by LED indicators, a sound or other indicia) when the magnetic flux is strong enough to affect the performance of the transformers 16, 18. As noted above, as the magnetic flux increases in the cores of the transformers 16, 18, the permeability of the core material decreases, thereby reducing the transfer efficiency of the transformers 16, 18 and also the impedances of the transformer windings. These reductions impact the operation of the circuitry that is driving and/or receiving energy from the transformers 16, 18. In a preferred embodiment, an ultrasonic flow sensor receives energy from the transformers 16, 18. The flow sensor includes two transducers that transmit and receive ultrasonic pulses with and against a respiratory flow of gas from a patient. The transducers of the ultrasonic flow sensor receive voltage bursts from the transformers 16, 18. Reductions in transfer of energy from the transformers 16, 18 caused by excessive magnetic flux will effect the operation of the transducers, as also described below.

The magnetic sensor 58 is mounted inside the magnetic shield 10, rather than outside the shield 10 to permit the sensor 58 to more precisely measure the magnetic field about the transformers 16, 18. As shown, the sensor 58 is preferably positioned for alignment with the most sensitive axis of the transformers 16, 18. In this position, the sensor 58 can determine the amount of magnetic flux along the direction most critical to the transformers 16, 18. In operation, the external circuit 60 receives a voltage output from the magnetic sensor 58. When the voltage output from sensor 58 deviates from that of a nominally zero field by a predetermined amount, in either polarity, the external circuit 60 signals a fault condition indicating that the critical magnetic field strength magnitude within the magnetic shield 10 has been exceeded. This fault indicates that the transducer's output is likely to be unstable because of the strength of the magnetic field surrounding the transformers 16, 18.

Figure 3:
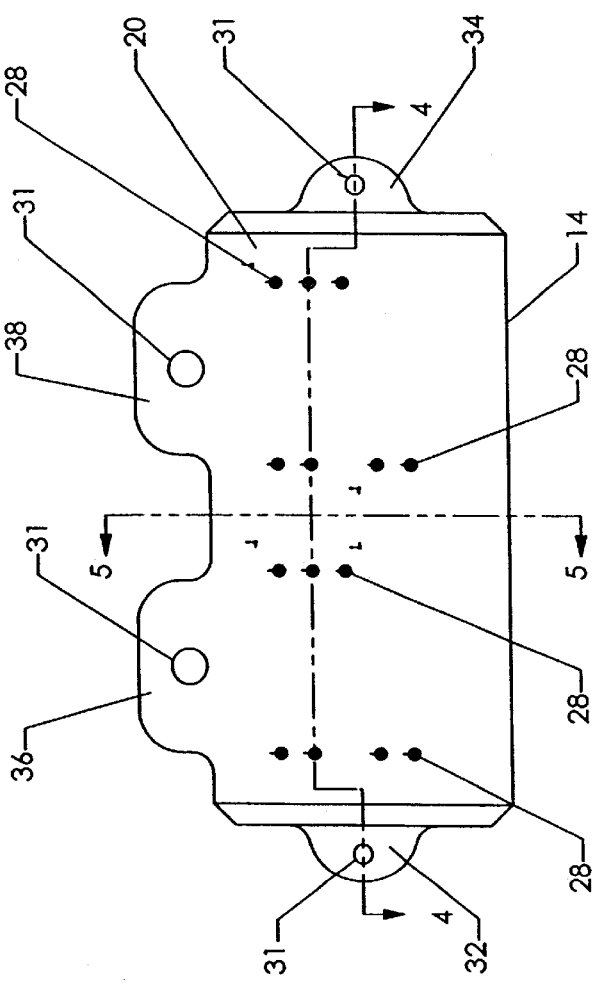
FIG. 3 is a bottom elevational view of the shielding device shown in FIG. 1.

FIG. 3 shows a bottom elevational view of the magnetic shield's bottom portion 14. As shown, the bottom portion 14 includes the substantially flat base 20 including the extending tabs 36, 38. The bottom portion 14 shown in FIG. 3 also includes tabs 32 and 34 extending from sides thereof. The tabs of the bottom portion 14 and top portion 12 are not critical to the preferred embodiments, and are illustrated as an exemplary approach to fasten the top portion 12 to the bottom portion 14 and to fasten the bottom portion to another object (e.g., a PC board, RF shield housing, anesthesia device) as described in greater detail below.

As described above, the base 20 of the bottom portion 14 also includes apertures 28. The apertures 28 are preferably aligned with pins 62 extending from the transformer 16 and 18. The pins 62 are generally used for transferring input and output signals to and from the transformers 16, 18 as readily understood by a skilled artisan. Suffice it to say that the pins 62 are used for communicating signals between the transformers 16, 18 and an energy source or a processing circuit (e.g., ultrasonic flow sensors, piezoelectric transducers). An insulating sleeve or layer (e.g., plastic) is placed between the pins 62 and inner circumferential walls of the apertures 28 to provide further insulation for the pins 62. The insulators may be attached to the apertures 28 or the pins 62 using any well-known adhesive methods (e.g., glue, heat sealing).

Figure 4:
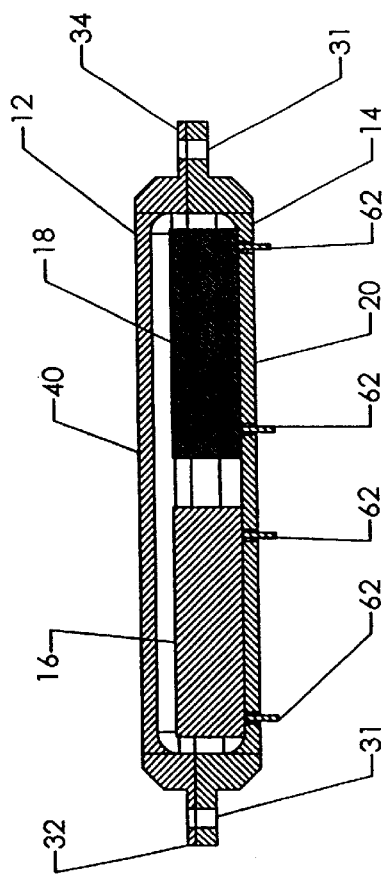
FIG. 4 is a cross-sectional view of the shielding device along line 4—4 of FIG. 3.

FIGS. 4 and 5 are cross-sectional views of the shield 10 and transformers 16, 18 taken along lines 4—4 and 5—5 of FIG. 3, respectively. As shown, the lower lip 44 of the top portion 12 and the upper lip 26 of the bottom portion 14 abut so that their walls 22, 42 and tabs are aligned. In this position, the magnetic shield 10 is closed and encloses the transformers 16, 18 therein for shunting magnetic flux around the transformers.

As shown in FIG. 5 and described above, the top portion 12 includes an aperture 54 through which wires 56 can extend from the magnetic field sensor 58 to the external circuit 60 that reads the magnetic flux measured by the sensor 58 and indicates when the magnetic flux exceeds a predetermined threshold. When the magnetic flux affecting the transformers 16, 18 exceeds the predetermined threshold, which may indicate possible saturation of the transformers, then the magnetic shield 10 and transformers 16, 18 should be moved to an area having a lower magnetic flux. In an MRI suite this can be accomplished simply by moving the exemplary magnetic shield 10 and transformers 16, 18 a small distance (e.g., a few inches) away from the MRI magnet.

As is readily understood by a skilled artesian, significant challenges to monitoring in the MRI suite are caused by the two large radio frequency (RF) coils which surround the patient. Typically, an outer coil transmits the RF signal while an inner coil receives the RF signal emitted from the patient. Because the RF signal emitted from the patient is so small (e.g., about $1\times10^{-8}$ watts), any RF interference in the environment (e.g., MRI suite) might wash out the RF signal emitted from the patient. Accordingly, an MRI suite must be shielded from outside RF interference, such as two-way radios, radio stations, television transmitters, beepers, etc., which may affect MRI RF reception. Likewise, any equipment used in the MRI suite that causes RF interference must also be RF shielded. Monitors and cables must be shielded because RF pulses are also capable of inducing electrical currents and causing interference within the electrical equipment.

One preferred approach for RF shielding the magnetic shield 10 is shown in FIG. 6. As shown, the RF shield comprises an electronics housing 64 that encloses the magnetic shield 10. The exemplary electronics housing 64 includes a housing lid 66 that covers a housing box 68 to enclose the magnetic shield 10, a filter 70, a PC board 72 and connectors 74. Filter 70 separates high frequency RF signals originating in the transducer's circuitry from the low frequency data signals output by the transducer's circuitry. The filter 70 prevents the RF from leaving the housing 64 via the cables connecting the transducer's circuitry to the anesthesia machine. The PC board 72 is attached to the magnetic shield 10, and in particular to the pins 62 of the transformers 16, 18. PC board 72 is the signal processing circuit for the flow sensor. It feeds the appropriate signals to the transformers and interprets the results. It then sends the resultant flow data to the anesthesia machine via a cable. The connectors 74 include a first connector 76 to ground, a second connector 78 to the flow sensor, and other connectors as needed to operate the electronic circuits (e.g., transformers, filter, magnetic flux sensor, etc.).

To provide an RF shield, the electronics housing 64 is formed of a layer of a material that reflects or absorbs RF signals such as copper or aluminum. While the electronics housing 64 is shown having an RF shield enclosing electronic devices and circuits (e.g., filter 70, PC board 72) in addition to the transformers 16, 18 and magnetic shield 10, it is understood that the RF shield can be in any form that shields the magnetic shield 10 and the flow sensor circuitry from RF interference. For example, the RF shield could be a thin layer of aluminum foil or copper that only surrounds the magnetic shield 10 and transformers 16, 18, or the RF shield could be in the form of a larger housing that encloses several electronic devices. As shown, the magnetic shield 10 is secured to the PC board 72 and the housing box 68 via screws. Also, the filter 70 and the housing lid 66 are connected to the housing box 68 via screws. It is understood that the above devices and circuits can be secured by other fasteners, including pins, clips or adhesive, and the securement is not limited to screws, but can incorporate any fasteners that can secure the devices and circuits together.

Figure 7:
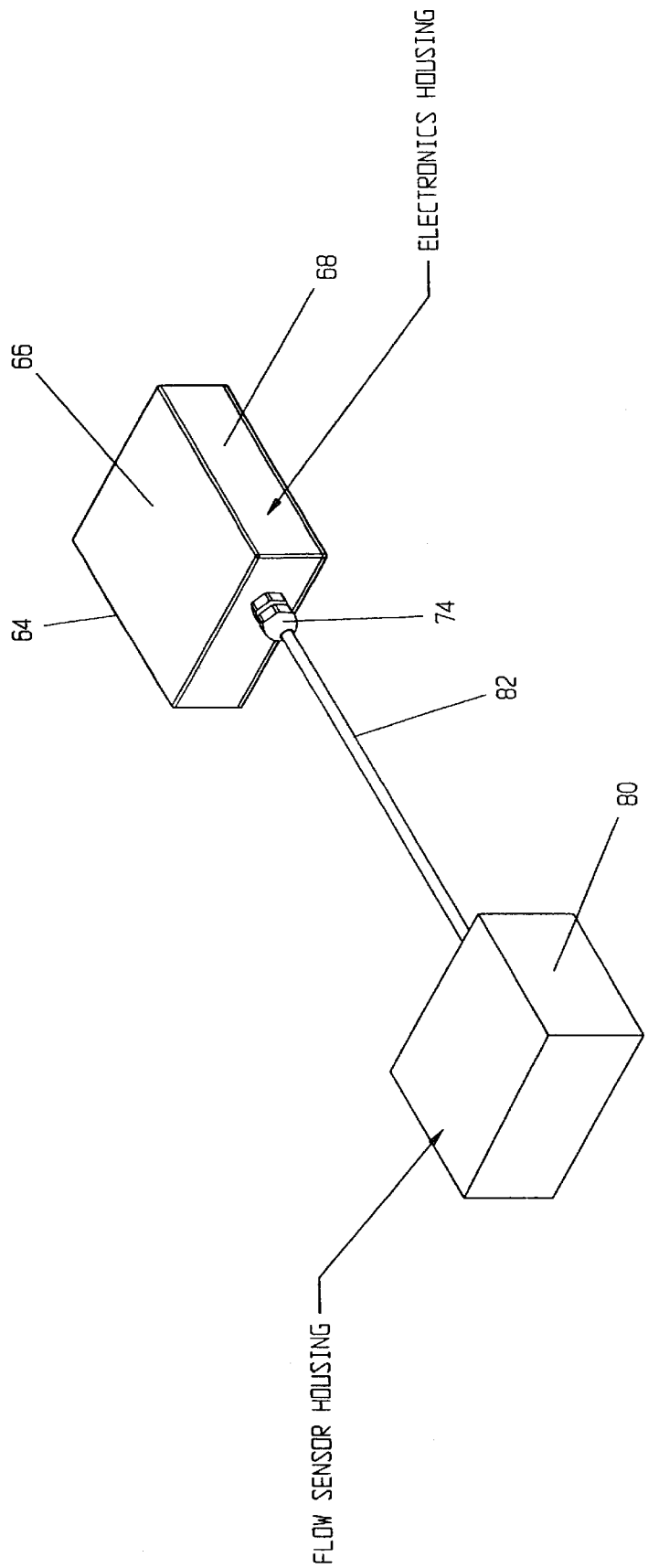
FIG. 7 is a perspective view of a flow sensing housing and electronics housing in accordance with a preferred embodiment of the invention.

The magnetic shield 10 preferably protects transformers 16, 18 used with processing circuits in a high magnetic environment (e.g., at or above 1.0 T). One example of a processing circuit is an ultrasonic flow sensor. FIG. 7 illustrates a perspective view of the electronics housing of FIG. 6 electrically connected to an ultrasonic flow sensor 80. As shown, the electronics housing 64 encloses the magnetic shield 10, which encloses first and second transformers 16, 18. The electronics housing 64 communicates with the flow sensor 80 via a cable 82. The cable 82 includes connectors and circuitry as needed to connect the transformers 16, 18 to the flow sensor 80.

In an ultrasonic flow sensor, transformers are needed to amplify the transmit and receive signals. In this preferred embodiment, the transformers 16, 18 are separated from the transducers of the ultrasonic flow sensor 80 because of the relative amount of magnetic flux at different locations relative to the magnet in an MRI scanner. As is readily known by a skilled artisan, the magnetic flux is highest closest to the magnet. In other words, the greater the distance from the magnet, the lower the magnetic flux. Accordingly, electronic equipment sensitive to magnetic flux will generally perform better when positioned further away from the magnet. The transformers 16, 18 used with the ultrasonic flow sensor 80 perform better when positioned close to the floor of an MRI suite, because the magnetic flux is lower at the floor than at the vertical height of the magnet's bore.

However, the ultrasonic flow sensor 80 should be positioned close to the patient to more accurately measure respiratory flow of the patient. In other words, respiratory flow of the patient is more accurately measured if the flow sensor 80 is closer to the patient because the amount of tubing from the patient to the sensor 80 is less than it would be if the sensor 80 were at the floor or further away from the patient. Accordingly, in order for both the transformers 16, 18 and the flow sensor 80 to perform optimally, the flow sensor 80 and transformers 16, 18 are separated so that the flow sensor 80 can be positioned in close proximity to the patient, and the transformers 16, 18 can be positioned farther away from the magnet. As discussed above, the transformers 16, 18 and flow sensor 80 are electrically connected by a cable 82, that is preferably RF shielded and which transfers the voltage from the transformers 16, 18 to the flow sensor 80 and back.

Figure 8:
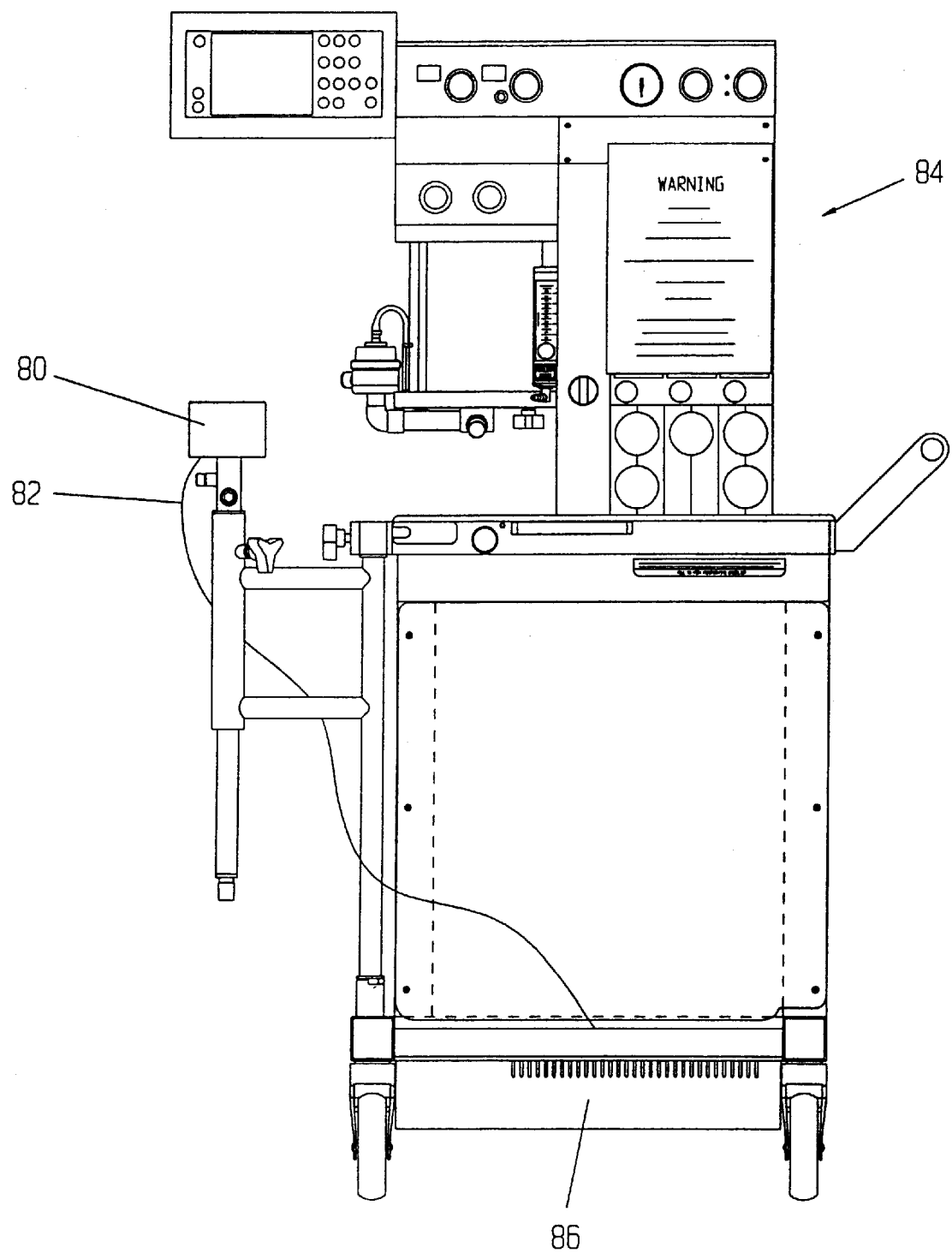
FIG. 8 is a side elevational view of an exemplary anesthesia device arranged for use in a high strength magnetic field in accordance with another preferred embodiment of the invention.

Preferred locations of the flow sensor 80 and transformers 16, 18 can be illustrated, by example, with an anesthesia device 84 in FIG. 8. As shown, the anesthesia device 84 is constructed with a minimal amount of ferromagnetic components to reduce attraction between the anesthesia device 84 and the MRI scanner, and also for the safety of persons in the MRI suite. Accordingly, the anesthesia device 84 is preferably constructed substantially with non-ferromagnetic materials, such as stainless steel, brass, aluminum and plastic. The anesthesia device 84 includes a battery box 86 near the bottom of the device which preferably contains the electronic housing 64 shown in FIG. 6. The battery box 86 is also preferably RF shielded to protect the electronic equipment contained therein.

It is understood that the transformers 16, 18 and magnetic shield 10 are not required to be placed in the electronics housing 64. However, the transformers 16, 18 and magnetic shield 10 are preferably RF shielded and positioned in the anesthesia device 84 distal to the magnet. Since the magnet in an MRI device is generally located a few feet above the floor for easier ingress and egress of a patient, and for attention from health care professionals, the position of the anesthesia device 84 that is most distal of the magnet is generally considered to be a location closest to the floor, such as a location within the battery box 86. The flow sensor 80 is preferably positioned proximate to the patient at about the extended height of the patient as shown, for example, by the location of the flow sensor 80 in FIG. 8. It is understood that the transformers 16, 18 in the magnetic shield 10 and the flow sensor 80 can be positioned, as desired, in accordance with the preferences of the health care professionals and the patient, in accordance with the MRI equipment.

It should be apparent from the aforementioned description and attached drawings that the concept of the present application may be readily applied to a variety of preferred embodiments, including those disclosed herein. Without further elaboration, the foregoing will so fully illustrate the invention that others may, by applying current or future knowledge, readily adapt the same for use under various conditions of service.

We claim:

1. An assembly for protecting a plurality of transformers in a magnetic suite, the assembly comprising:
   first and second transformers transferring electrical energy from an energy source to a processing circuit;
   a magnetic shield enclosing the first and second transformers, the magnetic shield preventing ambient magnetic flux from interfering with the transformers; and
   a magnetic field sensor mounted within the shield, the sensor positioned between the first and second transformers to measure the magnetic flux affecting the transformers.

2. The assembly of claim 1, each transformer including a coil wound about a core such that the operation of the first and second transformers depends upon the magnetic characteristics of the core.

3. The assembly of claim 2, the core formed of a material including iron.

4. The assembly of claim 1, the magnetic shield formed of a material that is permeable to the ambient magnetic flux to shunt the flux around the transformers.

5. The assembly of claim 4, the material including hot rolled steel.

6. The assembly of claim 1, the processing circuit comprising a flow sensor including a sensor element connected to the processing circuit, the flow sensor arranged to measure a flow of fluid from a patient.

7. The assembly of claim 1, the processing circuit comprising an ultrasonic flow sensor that measures respiratory flow rate by recording the time of flight of first and second ultrasonic pulses transmitted along a wave path with and against the respiratory flow path.

8. The assembly of claim 1, further comprising a housing enclosing the first and second transformers, the housing having an RF shield blocking radio frequency signals from entering and exiting the housing.

9. The assembly of claim 1, further comprising an RF shield housing enclosing the transformer and magnetic shield, the RF shield housing blocking RF signals from entering and exiting the housing.

10. The assembly of claim 1, the transformers being step-up transformers.

11. The assembly of claim 1, further comprising a warning circuit communicating with the magnetic field sensor for indicating when the magnetic flux exceeds a predetermined threshold.

12. The assembly of claim 1, wherein the transformers do not saturate in a magnetic field less than 600 gauss.

13. The assembly of claim 1, the assembly used with anesthesia equipment in an MRI suite, the suite including a Magnetic Resonance Imaging device having a magnet.

14. The assembly of claim 13, the anesthesia equipment having a proximal portion at approximately the vertical height of the magnet and a lower portion distal the proximal portion, the magnetic shield secured to the lower portion of the anesthesia equipment.

15. The assembly of claim 1, further comprising a cable electrically connecting the transformer and the processing circuit, and a sleeve enclosing the cable along its length there between, the sleeve arranged to provide an RF shield between the cable and the ambient environment.

16. A method for protecting two or more transformers in a magnetic suite, the transformers transferring electrical energy from an energy source circuit to a processing circuit, the method comprising:
    enclosing the two or more transformers in a magnetic shield, the magnetic shield preventing ambient magnetic flux from interfering with the transformers;
    enclosing the two or more transformers in a radio frequency (RF) shield housing, the RF shield housing preventing RE signals from entering and exiting the housing; and
    mounting a magnetic field sensor between the transformers in the magnetic shield, the sensor measuring the magnetic flux magnitude within the magnetic shield.

17. The method of claim 16, further comprising securing the RF shield housing to an anesthesia machine, the anesthesia machine arranged for operation in an MRI suite proximate an MRI machine.

18. The method of claim 16, further comprising coupling the magnetic sensor to a warning circuit for indicating when the magnetic flux magnitude within the magnetic shield exceeds a predetermined threshold.

19. A housing for protecting a plurality of transformers from saturation via ambient magnetic flux, the transformers transferring electrical energy from an energy source to a processing circuit, the housing enclosing the transformers and comprising first and second shielding sections, the first shielding section partially enclosing the transformers and including a first shielding layer formed of a material that is permeable to the ambient magnetic flux, the second shielding section partially enclosing the transformers and including a second shielding layer formed of a material that is permeable to the ambient magnetic flux, the first and second shielding sections arranged to fit together to enclose the transformers and shunt the magnetic flux around the transformers, the housing further comprising a magnetic field sensor mounted within the housing between two of the transformers to measure the magnetic flux affecting the transformers.

20. The housing of claim 19, further comprising a warning circuit for determining when the magnetic flux exceeds a predetermined threshold.

21. The housing of claim 19, the permeable material including hot rolled steel.

22. The housing of claim 19, wherein the housing protects the transformers in a magnetic field of less than 1.5 T.

23. The housing of claim 19, wherein the processing circuit includes a flow sensor that measures the respiratory flow rate of a person in an MRI suite.

24. The housing of claim 19, wherein the housing is positioned within a radio frequency shield arranged for blocking radio frequency interference from exiting or entering the housing.

25. The housing of claim 19, the processing circuit comprising an ultrasonic flow sensor that measures respiratory flow rate by recording the time of flight of first and second ultrasonic pulses transmitted along a wave path with and against the respiratory flow path.

* * * * *